(12) United States Patent
Huang et al.

(10) Patent No.: US 9,837,401 B2
(45) Date of Patent: Dec. 5, 2017

(54) SEMICONDUCTOR DEVICES, TRANSISTORS, AND METHODS OF MANUFACTURE THEREOF

(71) Applicant: Taiwan Semiconductor Manufacturing Company, Ltd., Hsin-Chu (TW)

(72) Inventors: Ching-Kun Huang, Jhubei (TW); Shih-Che Lin, Toufen Township (TW); Hung-Chih Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 48 days.

(21) Appl. No.: 14/535,920

(22) Filed: Nov. 7, 2014

(65) Prior Publication Data

US 2015/0061035 A1    Mar. 5, 2015

Related U.S. Application Data

(62) Division of application No. 13/533,749, filed on Jun. 26, 2012, now Pat. No. 8,883,583.

(51) Int. Cl.
| | |
|---|---|
| *H01L 29/76* | (2006.01) |
| *H01L 29/94* | (2006.01) |
| *H01L 27/088* | (2006.01) |
| *H01L 29/78* | (2006.01) |
| *H01L 29/423* | (2006.01) |
| *H01L 29/66* | (2006.01) |
| *H01L 29/45* | (2006.01) |
| *H01L 29/49* | (2006.01) |

(52) U.S. Cl.
CPC ...... *H01L 27/088* (2013.01); *H01L 29/42376* (2013.01); *H01L 29/45* (2013.01); *H01L 29/4975* (2013.01); *H01L 29/665* (2013.01); *H01L 29/6653* (2013.01); *H01L 29/6656* (2013.01); *H01L 29/78* (2013.01)

(58) Field of Classification Search
CPC ............... H01L 27/088; H01L 29/4975; H01L 29/42376; H01L 29/49
USPC ........................................................ 257/384
See application file for complete search history.

(56) References Cited

U.S. PATENT DOCUMENTS

| | | | |
|---|---|---|---|
| 6,194,279 B1 * | 2/2001 | Chen ................. | H01L 21/28247 257/E21.438 |
| 6,261,911 B1 | 7/2001 | Lee et al. | |
| (Continued) | | | |

FOREIGN PATENT DOCUMENTS

| | | |
|---|---|---|
| KR | 20040022605 | 3/2004 |
| KR | 1020060091600 | 8/2006 |
| (Continued) | | |

*Primary Examiner* — Theresa T Doan
(74) *Attorney, Agent, or Firm* — Slater Matsil, LLP (57) ABSTRACT

Semiconductor devices, transistors, and methods of manufacture thereof are disclosed. In one embodiment, a semiconductor device includes a gate dielectric disposed over a workpiece, a gate disposed over the gate dielectric, and a spacer disposed over sidewalls of the gate and the gate dielectric. A source region is disposed proximate the spacer on a first side of the gate, and a drain region is disposed proximate the spacer on a second side of the gate. A metal layer is disposed over the source region and the drain region. The metal layer extends beneath the spacers by about 25% or greater than a width of the spacers.

18 Claims, 6 Drawing Sheets

(56) References Cited

U.S. PATENT DOCUMENTS

| | | | |
|---|---|---|---|
| 6,465,847 B1* | 10/2002 | Krishnan | H01L 29/458 257/347 |
| 6,518,631 B1* | 2/2003 | En | H01L 29/41733 257/334 |
| 6,806,126 B1 | 10/2004 | Luning | |
| 6,991,991 B2* | 1/2006 | Cheng | H01L 21/02052 257/E21.228 |
| 7,429,775 B1* | 9/2008 | Nayak | H01L 21/823807 257/288 |
| 2005/0009285 A1 | 1/2005 | Luning et al. | |
| 2005/0101093 A1 | 5/2005 | Cheng et al. | |
| 2006/0166424 A1* | 7/2006 | Schaeffer, III | H01L 21/823835 438/199 |
| 2011/0215376 A1* | 9/2011 | Holt | H01L 29/78 257/192 |

FOREIGN PATENT DOCUMENTS

| | | |
|---|---|---|
| KR | 20100055824 | 5/2010 |
| TW | 200703647 A | 1/2007 |

* cited by examiner

SEMICONDUCTOR DEVICES, TRANSISTORS, AND METHODS OF MANUFACTURE THEREOF

This application is a divisional of U.S. Ser. No. 13/533,749, filed Jun. 26, 2012 entitled "Semiconductor Devices, Transistors, and Methods of Manufacture Thereof," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components can introduce challenges into manufacturing process flows for semiconductor devices.

Transistors are elements that are fundamental building blocks of electronic systems and integrated circuits (ICs). Transistors are commonly used in semiconductor devices to amplify and switch electronic power and perform other operations. In semiconductor devices, silicide materials are often used to reduce resistances of portions of transistors, such as gates, sources, and drains.

What are needed in the art are improved transistor designs and manufacturing methods for semiconductor devices.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to semiconductor devices and transistors. Novel methods of manufacturing semiconductor devices and transistors and structures thereof will be described herein.

Figure 1:
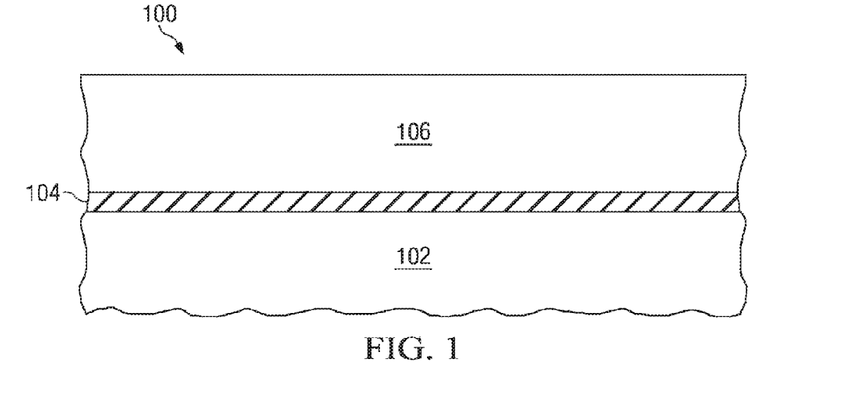
FIGS. 1 through 6 show cross-sectional views of a method of manufacturing a transistor of a semiconductor device at various stages in accordance with an embodiment of the present disclosure.

FIGS. 1 through 6 show cross-sectional views of a method of manufacturing a transistor 130 (see FIGS. 8A and 8B) of a semiconductor device 100 at various stages of manufacturing in accordance with an embodiment of the present disclosure. Referring first to FIG. 1, there is shown a cross-sectional view of a semiconductor device 100. To manufacture the semiconductor device 100, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

A gate dielectric material 104 is formed over the workpiece 102, as shown in FIG. 1. The gate dielectric material 104 may comprise $SiO_2$, $SiO_x$, SiN, other dielectric materials, or combinations or multiple layers thereof formed by chemical vapor deposition (CVD) or other methods. A gate material 106 is formed over the gate dielectric material 104, also shown in FIG. 1. The gate material 106 may comprise doped silicon or other semiconductive materials deposited by CVD or other methods. Alternatively, the gate dielectric material 104 and the gate material 106 may comprise other materials and may be formed using other methods. The gate 106 and gate dielectric 104 each comprise a thickness of a predetermined amount as a function of properties of the transistor 130 desired.

Figure 2:
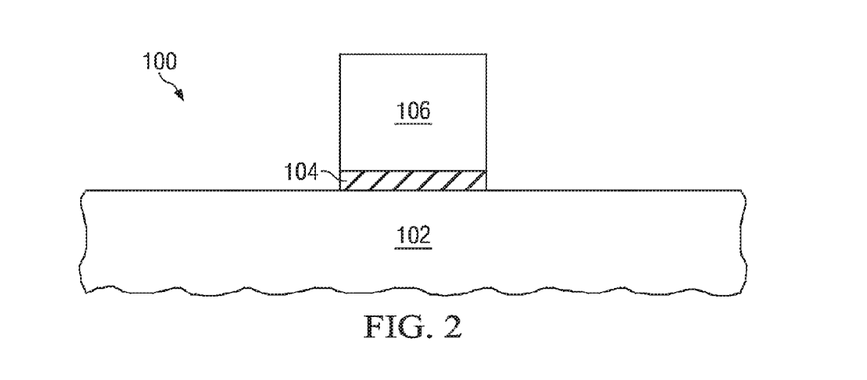

The gate material 106 and the gate dielectric material 104 are patterned using a photolithography process, forming a gate dielectric 104 and gate 106 of a transistor, as shown in FIG. 2. For example, a layer of photoresist (not shown) may be formed over the gate material 106 shown in FIG. 1, and the layer of photoresist is patterned by transmitting light or energy through or reflected from a lithography mask (also not shown) towards the layer of photoresist. Exposed (or unexposed, depending on whether a positive or negative photoresist is used) portions of the layer of photoresist are developed and then ashed or etched away. The patterned layer of photoresist is used as an etch mask while portions of the gate material 106 and the gate dielectric material 104 are etched away, leaving the gate 106 and gate dielectric 104 shown in FIG. 2. The remaining layer of photoresist is then removed. Alternatively, a direct patterning method may be used to pattern the gate material 106 and the gate dielectric material 104, as another example. The gate 106 and gate dielectric 104 have a width of a predetermined amount and extend in and out of the paper by a predetermined amount, depending on properties of the transistor 130 desired. In some embodiments, offset spacers may be formed in sidewalls of the gate 106 and gate dielectric 104, to be described further herein.

Figure 3:
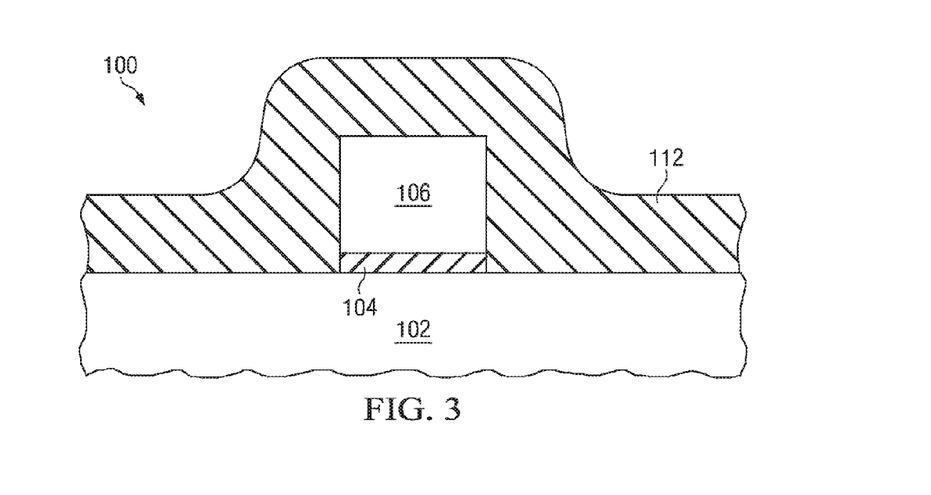

A spacer material 112 is formed over the workpiece 102 over the top surface of the gate 106, over sidewalls of the gate 106 and the gate dielectric 104, and over exposed portions of the workpiece 102, as shown in FIG. 3. The spacer material 112 may comprise about 500 nm or less of an insulating material, such as $SiO_x$, $SiN_x$, $SiO_xN_y$, other insulating materials, or combinations or multiple layers thereof, as examples, although alternatively, the spacer material 112 may comprise other materials and dimensions.

Figure 4:
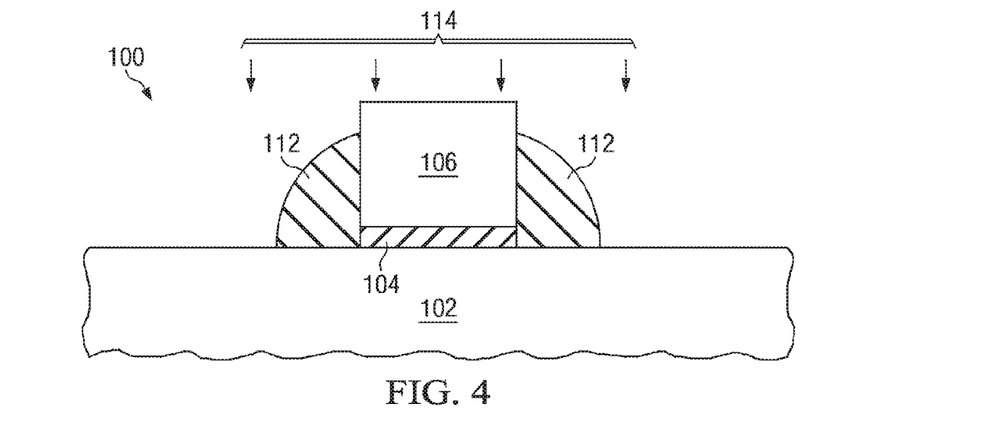

A first etch process 114 is used to remove portions of the spacer material 112 from the top surface of the workpiece 102 and the top surface of the gate 106, as shown in FIG. 4, leaving spacers 112 disposed on sidewalls of the gate 106 and the gate dielectric 104. The first etch process 114 may comprise an anisotropic etch process that is adapted to etch away more of the spacer material 112 from top surfaces of the workpiece 102 and the gate 106, leaving spacers 112 on sidewalls of the gate 106 and gate dielectric 104, as shown in FIG. 4.

Figure 5:
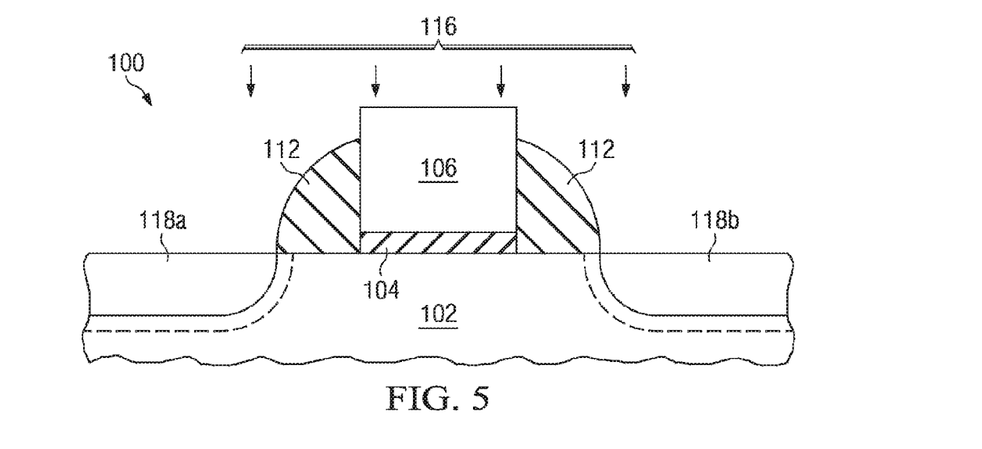

An implantation process 116 is used to form source and drain regions 118a and 118b proximate the spacers 112, as shown in FIG. 5. The implantation process 116 comprises implanting dopant ions into the workpiece 102 proximate the spacers 112. The type of dopant ions used are a function of the type of transistor 130 to be formed, e.g., a p-channel metal oxide semiconductor (PMOS) device or an n-channel MOS (NMOS) device. The transistor 130 (see FIGS. 7 and 8) can alternatively include lightly doped drain (LDD) regions (not shown) formed in the workpiece 102 prior to forming the spacers 112. The implantation process 116 may comprise subsequently implanting a heavily doped impurity distribution, to form source and drain region 118a and 118b implantation regions, as will be familiar to those skilled in the field of semiconductor device processing, for example. The workpiece 102 may optionally be heated or annealed to drive the dopants deeper into the workpiece 102, as shown in phantom in FIG. 5.

The source region 118a is formed proximate the spacer 112 on a first side (e.g., on the left side of the gate 106 in the drawings) of the gate 106. A drain region 118b is formed proximate the spacer 112 on a second side (e.g., on the right side of the gate 106 in the drawings) of the gate 106 that is opposite the first side of the gate 106. Region 118a is labeled as a source region, and region 118b is labeled as a drain region in the figures; alternatively, region 118a may comprise a drain region and region 118b may comprise a source region, as examples.

Figure 6:
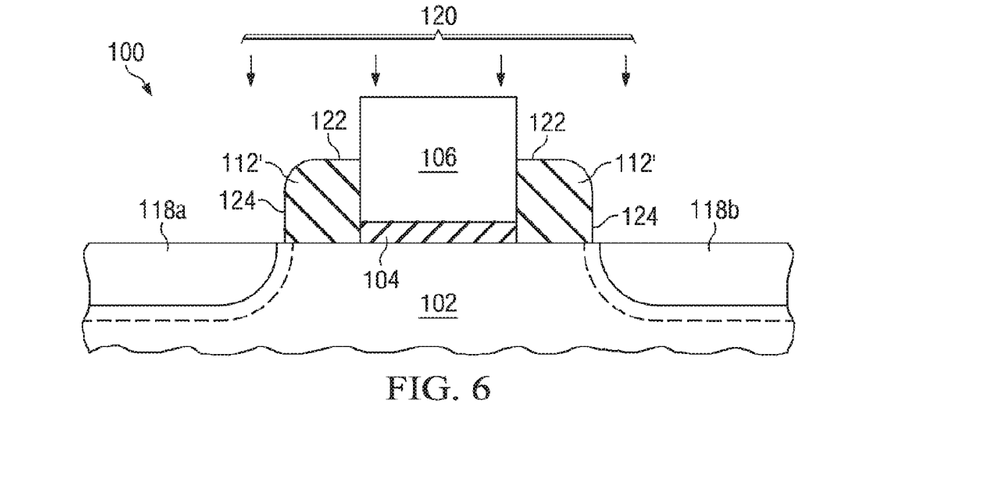

After the implantation process 116, a portion of the spacers 112 is removed using a second etch process 120, as shown in FIG. 6, forming reshaped spacers 112'. The portion of the spacers 112 removed includes a top portion of the spacers 112 on the top surface 122 of the spacers 112. The portion of the spacers 112 removed also includes a portion of the spacers along sidewalls 124 of the spacers 112. The portion of the spacers 112 removed may also include a portion of the outer corners or shoulders of the spacers 112. The amount of material removed from the spacers 112 depends on the desired shape of the reshaped spacers 112', the type of etch process 120 used, parameters of the etch process 120, the type of material of the spacers 112', and other variables, as examples.

Figure 8A:
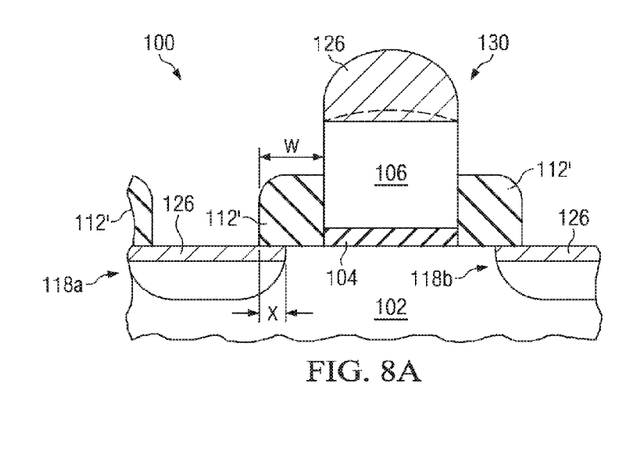
FIGS. 8A and 8B are cross-sectional views of the transistor shown in FIGS. 7A and 7B, respectively, after a metal layer comprising a silicide material is formed on the gate, source region, and drain region of the transistor in accordance with embodiments.
Figure 8B:
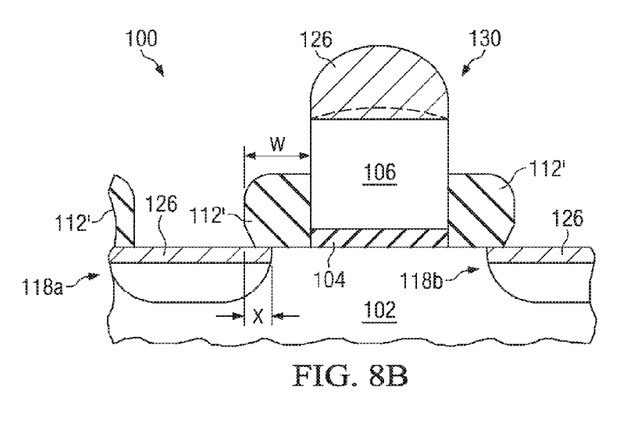

The etch process 120 is used to reshape the spacers 112' to improve a metal layer 126 formation process (not shown in FIG. 6; see metal layer 126 shown in FIGS. 8A and 8B, to be described further herein). Removing the portion of the spacers 112 comprises reshaping the spacers 112', for example. The etch process 120 may comprise a dry etch process or a wet etch process, as examples. A masking material is not used during the etch process 120 of the spacers 112' in some embodiments. The etch process 120 comprises a "spacer push" process in other embodiments, for example.

In some embodiments, the source and drain regions 118a and 118b are formed using an implantation process, after the etch process 120 used to reshape the spacers 112 and form the reshaped spacers 112'.

Figure 7A:
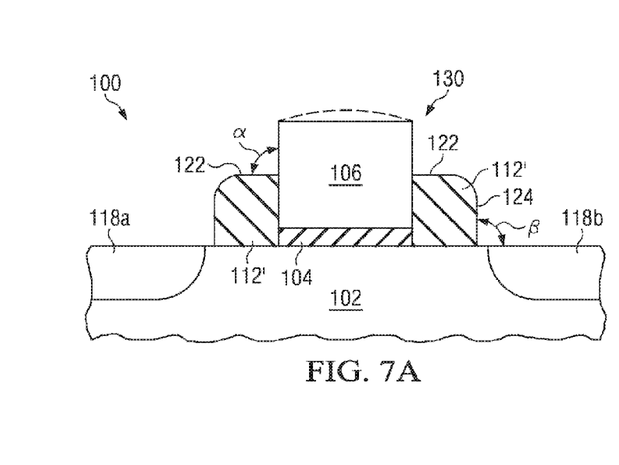
FIG. 7A is a more detailed view of FIG. 6, illustrating angles of portions of spacers of the transistor in accordance with an embodiment.
Figure 7B:
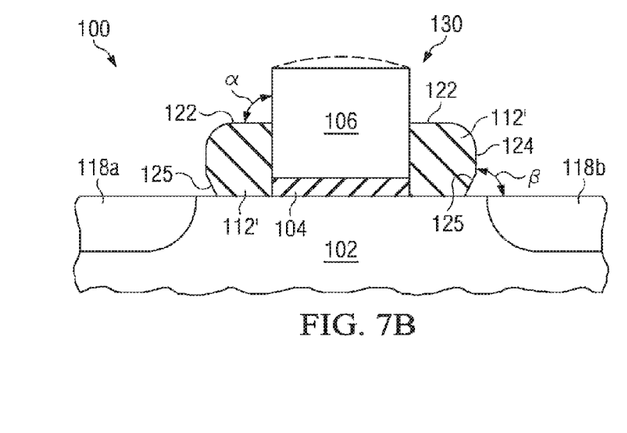
FIG. 7B is a more detailed view of FIG. 6, illustrating angles of portions of spacers of the transistor in accordance with another embodiment.

FIGS. 7A and 7B are more detailed views of FIG. 6, illustrating angles α and β of spacers 112' of the transistor 130 in accordance with embodiments. Removing the portion of the spacers 112 using the etch process 120 comprises increasing an angle α of a top surface 122 of the spacers 112' with respect to a sidewall of the gate 106, in a region of the spacer 112' proximate the sidewall of the gate 106 (e.g., at a region of the spacer 112' proximate the top surface 122 of the spacer 112'). The angle α of the spacers 112' is an angle of a shoulder of the spacer 112', for example. The angle α between the top surface 122 of the spacers 112' and the sidewall of the gate 106 comprises about 90 to 95 degrees proximate the sidewall of the gate 106 in accordance with some embodiments, for example.

Furthermore, removing the portion of the spacers 112 using the etch process 120 comprises decreasing an angle β of a sidewall 124 of the spacers 112' with respect to a top surface of the workpiece 102, proximate the top surface of the workpiece 102 (e.g., at a region of the spacers 112' proximate the top surface of the workpiece 102). Removing the portion of the spacers 112 comprises undercutting a lower portion 125 of the spacers 112' proximate the top surface of the workpiece 102 in some embodiments, for example, shown in FIG. 7B. The angle β of the spacers 112' is an angle of the footing of the spacer 112', for example. The angle β between the sidewall 124 of the spacers 112' and the top surface of the workpiece 102 comprises less than about 90 degrees proximate the top surface of the workpiece 102, for example, in some embodiments.

FIGS. 8A and 8B are cross-sectional views of the transistor 130 shown in FIGS. 7A and 7B, respectively, after a metal layer 126 has been formed on the top surfaces of the gate 106 and the source and drain regions 118a and 118b of the transistor 130. The metal layer 126 comprises a silicide in some embodiments, for example. The metal layer 126 is formed over the source region 118a, the drain region 118b, and the gate 106 using a silicidation process. The metal layer 126 may comprise Ni, Ti, Co, other metals, or combinations thereof, as examples. The metal layer 126 is formed in some embodiments by deposition using radio-frequency (RF) sputtering or physical vapor deposition (PVD), as examples.

An annealing cycle, performed using conventional furnace procedures or using a rapid thermal anneal (RTA) procedure is used to form the metal layer 126 comprising a silicide material, such as nickel silicide, titanium silicide, cobalt silicide, or other silicides on the exposed polysilicon or silicon surfaces of the workpiece 102 and gate 106. The unreacted metal is then removed using a solution. The metal layer 126 results in a desired performance enhancement of the transistor 130 due to the formation of the metal layer 126, such as reduced leakage current, reduced contact resistance, and other improved parameters of the transistor 130. The metal layer 126 may alternatively comprise other materials and may be formed using other methods.

The metal layer 126 may have a top surface that is curved in some embodiments, as shown in FIGS. 8A and 8B. The top surface of the gate 106 before the silicidation process may also be curved, as shown in phantom in FIGS. 7A, 7B, 8A, and 8B. The top surfaces of the metal layer 126 and gate 106 may comprise a raised curve shape, for example.

The novel etch process 120 that is used to reshape the spacers 112 to form the reshaped spacers 112' results in a metal layer 126 being formed in a subsequent process step over the source region 118a and the drain region 118b, wherein the metal layer 126 extends beneath the spacers 112' by an amount comprising dimension x. Dimension x comprises about 25% or greater than a width w of the spacers 112' in some embodiments, for example, due the novel shape of the spacers 112' formed by the etch process 120. The encroachment ratio of the metal layer 126 comprises ratio (x/w) of about 25% or greater, for example. In some embodiments, the encroachment ratio may comprise about 50 to 55%, as another example. The angles α and β of spacers 112' and the undercut of the spacers 112' proximate the workpiece 102 top surface advantageously results in an increase in the amount of silicide encroachment, forming an increased dimension x of the metal layer 126 beneath the spacers 112'. The high encroachment ratio (x/w) of the metal layer 126 formed results in improved performance of the transistor 130.

Note that only one transistor 130 is shown in the embodiments shown in FIGS. 1 through 8B; however, a plurality of transistors 130 is typically formed across a surface of a workpiece 102 simultaneously. For example, in FIGS. 9A and 9B, two transistors 130a and 130b are shown formed on the workpiece 102. Transistor 130a may be formed in one region of the workpiece 102, and transistor 130b may be formed in another region of the workpiece 102, for example. Hundreds or thousands of the transistors 130, 130a, and 130b described herein may be formed across the surface of the workpiece 102, depending on the semiconductor device 100 design and size, in accordance with embodiments of the present disclosure.

Figure 9A:
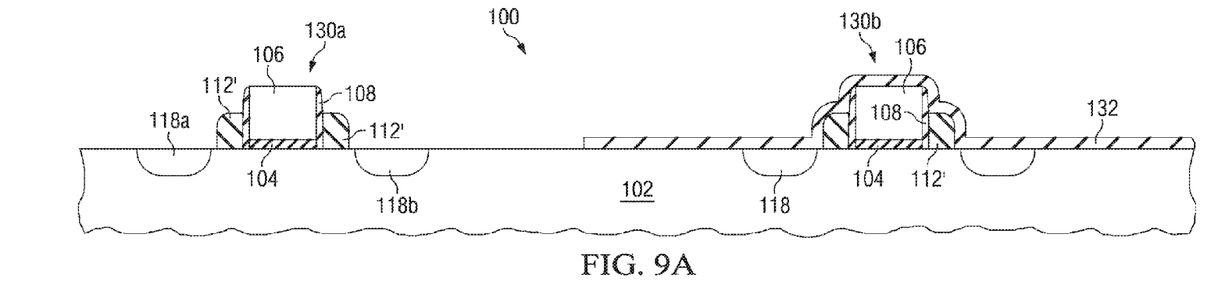
FIG. 9A illustrates a resist protection oxide (RPO) formed on a non-silicide region of a workpiece of the semiconductor device in accordance with an embodiment.
Figure 9B:
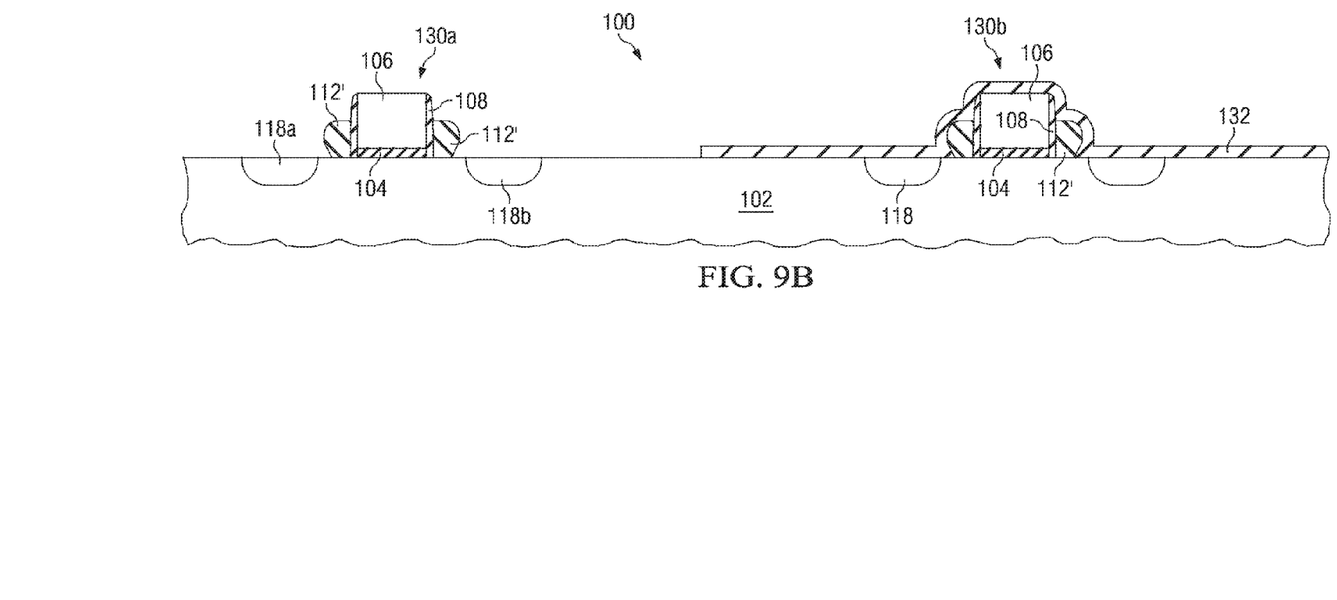
FIG. 9B illustrates a resist protection oxide (RPO) formed on a non-silicide region of a workpiece of the semiconductor device in accordance with another embodiment.

The etch process 120 that is used to reshape the spacers 112 and form the reshaped spacers 112' is advantageously performed after or before the implantation process 116 for the source and drain regions 118a and 118b, yet before additional insulating material layers are formed over the workpiece 102 over the transistors 130, in accordance with embodiments. As one example, the etch process 120 used to form the reshaped spacers 112' is performed before a resist protection oxide (RPO) is formed on the workpiece 102 in some embodiments. The RPO may optionally be formed over the entire surface of the workpiece 102 after the etch process 120, and the RPO is then removed from portions of the workpiece 102, as shown in FIG. 9A, which illustrates an RPO 132 formed on a region of a workpiece 102 of the semiconductor device 100 in accordance with an embodiment in a cross-sectional view. Transistor 130a comprises a transistor 130a in which a metal layer 126 will be formed on the gate 106, source region 118a, and drain region 118b, and transistor 130b comprises a transistor 130b in which a metal layer 126 will not be formed. Transistor 130a may reside in a peripheral logic region or other type of region that requires silicidation in order to reduce contact resistance. Transistor 130b may reside in a non-silicide region, such as a main region for a memory matrix that does not require silicidation, as an example. Transistors 130a and 130b may alternatively reside in other types of regions of the semiconductor device 100. FIG. 9B illustrates an alternative embodiment to FIG. 9A, wherein lower portions of spacers 112' proximate the top surface of the workpiece 102 are undercut as described herein for FIG. 7B.

The RPO 132 is formed over the entire workpiece 102, e.g., over both transistors 130a and 130b. The RPO 132 is then removed from over transistor 130a using a lithography process, leaving the structure shown in FIG. 9A or 9B. Because the etch process 120 was used to reshape the spacers 112' after the implantation process 116 rather than after the RPO 132 formation, a subsequent silicidation process (e.g., that is used to form metal layer 126, as described for FIGS. 8A and 8B), is not deleteriously impacted by the formation of the RPO 132 over the workpiece 102.

Figure 10A:
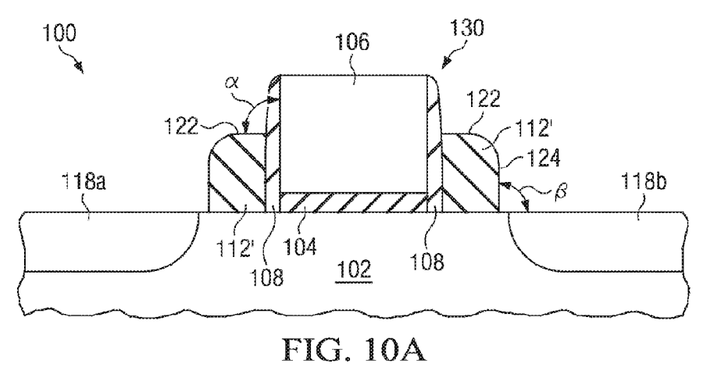
FIG. 10A is a cross-sectional view of a semiconductor device illustrating a transistor in accordance with another embodiment.
Figure 10B:
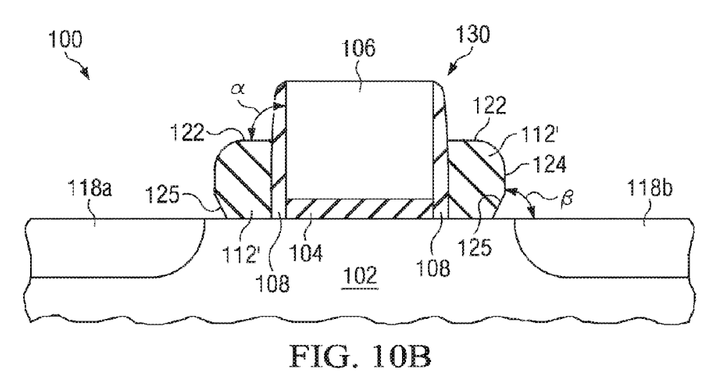
FIG. 10B is a cross-sectional view of a semiconductor device illustrating a transistor in accordance with another embodiment.

FIG. 10A is a cross-sectional view of a semiconductor device 100 illustrating a transistor 130 in accordance with another embodiment. Before the spacer 112 is formed and reshaped to form the reshaped spacer 112', a first spacer 108 comprising an offset spacer is formed on the sidewalls of the gate 106 and the gate dielectric 104. The offset spacer 108 comprises a similar material described for the spacer 112 material and may be formed using similar methods as the spacer 112. The offset spacer 108 may comprise the same material as, or a different material than, the spacer 112', for example. The spacers 112' comprise main spacers that are formed on the sidewalls of the offset spacer 108 in this embodiment. One of the offset spacers 108 is disposed between each of the main spacers 112 and the sidewalls of the gate 106 and the gate dielectric 104. An implantation process or processes and anneal processes may be performed before or after forming the offset spacer 108 and/or the main spacers 112 or 112' to form the source and drain regions 118a and 118b, depending on the transistor 130 design, for example. The processing of the transistor 130 is then continued using similar processing steps that were described for the embodiment shown in FIGS. 1 through 8. The embodiment illustrated in FIG. 10B is the same as that shown in FIG. 10A with the inclusion of undercutting a lower portion 125 of the spacers 112' proximate the top surface of the workpiece 102 as described herein for FIG. 7B.

Figure 11:
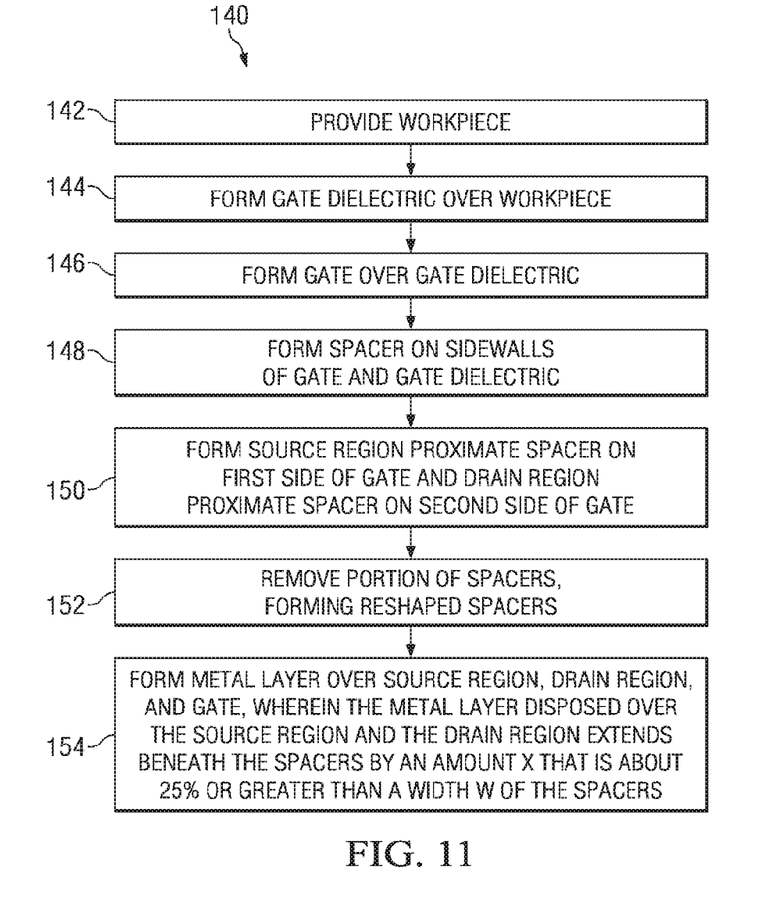
FIG. 11 is a flow chart illustrating a method of manufacturing a semiconductor device in accordance with an embodiment of the present disclosure.

FIG. 11 is a flow chart 140 illustrating a method of manufacturing a semiconductor device 100 in accordance with an embodiment. In step 142, a workpiece 102 is provided. In step 144, a gate dielectric 104 is formed over the workpiece 102. In step 146, a gate 106 is formed over the gate dielectric 104. A spacer 112 is formed on sidewalls of the gate 106 and the gate dielectric 104 in step 148. In step 150, a source region 118a is formed proximate the spacer 112 on a first side of the gate 106, and a drain region 118b is formed proximate the spacer 112 on a second side of the gate 106, the second side being opposite the first side. In step 152, a portion of the spacers 112 is removed, forming reshaped spacers 112'. In step 154, a metal layer 126 is formed over the source region 118a, the drain region 118b, and the gate 106. The metal layer 126 disposed over the source region 118a and the drain region 118b extends beneath the spacers 112' by an amount x that is about 25% or greater than a width w of the spacers 112', as shown in FIGS. 8A and 8B.

After the transistors 130, 130a, and 130b are formed using the manufacturing methods described herein, additional material layers are then deposited and formed over the transistors 130, 130a, and 130b to complete the manufacturing process for the semiconductor device 130. For example, one or more insulating materials and conductive material layers may be formed over the transistors 130, 130a, and 130b, not shown. Contacts are formed in the insulating material layers to make electrical contact to the gate 106 and source and drain regions 118a and 118b that include the metal layer 126, for example, also not shown.

Embodiments of the present disclosure include methods of forming transistors 130 and semiconductor devices 100. Embodiments of the present disclosure also include semiconductor devices 100 that include the novel transistors 130 described herein.

Advantages of embodiments of the disclosure include providing novel semiconductor devices 100 and transistors 130 wherein a metal layer 126 formed over the source and drain regions 118a and 118b extends by about 25% or more beneath spacers 112' on sidewalls of the gate 106 and gate dielectric 104 material, providing improved transistors 130 with source and drain regions 118a and 118b having reduced resistance and improved operating performance. The undercut profile of the spacers 112', e.g., at the spacer 112' footing, increases the encroachment ratio so that the metal layer 126 comprising the silicide regions extends further beneath the spacers 112'.

Performing the etch process 120 used to reshape the spacers 112 and form reshaped spacers 112' prior to the RPO 132 process shown in FIGS. 9A and 9B improves a process window for the metal layer 126 formation. Performing the etch process 120 at this time in the manufacturing process flow provides a more controllable spacer 112' profile that enlarges the polysilicon-to-polysilicon (poly/poly) space of the source and drain regions 118a and 118b of the transistors 130, 130a, and 130b. Enlarging the poly/poly space is particularly advantageous in advanced technologies wherein features sizes are reduced, for example.

The reshaped spacers 112' result in increased silicon loss of the workpiece 102 proximate the gate dielectric 104, e.g., comprising a silicon loss of about 3.5 nm in some applications after the silicide process, as an example. The reshaped spacers 112' result in the formation of the metal layer 126 over the source and drain regions 118a and 118b that is deeper and wider, e.g., providing source and drain regions 118a and 118b that are wider beneath the spacers 112' by about 2 nm in some applications. Alternatively, the amount of silicon loss and increased width of the source and drain regions 118a and 118b may comprise other values.

The etch process 120 used to form the reshaped spacers 112' also reduces roughness of the spacers 112' caused by etch process 114 used to form the spacers 112 and other previous processes. The etch process 120 forms spacers 112' with a smoother profile, which further improves silicide formation. The novel semiconductor devices 100, transistors 130, 130a, and 130b, and manufacturing methods and designs described herein are easily implementable in manufacturing process flows.

In accordance with one embodiment of the present disclosure, a semiconductor device includes a gate dielectric disposed over a workpiece, a gate disposed over the gate dielectric, and a spacer disposed over sidewalls of the gate and the gate dielectric. A source region is disposed proximate the spacer on a first side of the gate, and a drain region is disposed proximate the spacer on a second side of the gate. A metal layer is disposed over the source region and the drain region. The metal layer extends beneath the spacers by about 25% or greater than a width of the spacers.

In accordance with another embodiment, a transistor includes a workpiece, a gate dielectric disposed over a workpiece, and a gate disposed over the gate dielectric. A spacer is disposed on sidewalls of the gate and the gate dielectric. A source region is disposed proximate the spacer on a first side of the gate, and a drain region is disposed proximate the spacer on a second side of the gate, the second side of the gate being opposite the first side of the gate. A silicide material is disposed over the source region, the drain region, and the gate. The silicide material disposed over the source region and the drain region extends beneath the spacers by about 25% or greater than a width of the spacers.

In accordance with yet another embodiment, a method of manufacturing a semiconductor device includes providing a workpiece, forming a gate dielectric over the workpiece, and forming a gate over the gate dielectric. The method includes forming a spacer on sidewalls of the gate and the gate dielectric, forming a source region proximate the spacer on a first side of the gate, and forming a drain region proximate the spacer on a second side of the gate, the second side being opposite the first side. A portion of the spacers is removed, and a metal layer is formed over the source region, the drain region, and the gate. The metal layer disposed over the source region and the drain region extends beneath the spacers by about 25% or greater than a width of the spacers.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A semiconductor device, comprising:
a gate dielectric disposed over a workpiece;
a gate disposed over the gate dielectric;
a spacer disposed on sidewalls of the gate and the gate dielectric, the spacer having an undercut proximate an upper surface of the workpiece;
a source/drain region proximate the spacer; and
a metal-containing layer disposed over the source/drain region and over the gate, wherein the metal-containing layer extends beneath the spacer by about 25% or greater than a width of the spacer, wherein the gate has a curved top surface, wherein a center of the curved top surface is further away from the workpiece than an edge of the curved top surface.

2. The semiconductor device according to claim 1, wherein the spacer includes a top surface, and wherein an angle between the top surface of the spacer and a sidewall of the gate is about 90 to 95 degrees.

3. The semiconductor device according to claim 1, wherein the spacer includes a sidewall, and wherein an angle between the sidewall of the spacer and the upper surface of the workpiece is less than about 90 degrees.

4. The semiconductor device according to claim 1, wherein the spacer comprises a main spacer and further comprises an offset spacer disposed between the main spacer and the sidewalls of the gate and gate dielectric, wherein the main spacer comprises a first material different from a second material of the offset spacer.

5. The semiconductor device according to claim 1, wherein the spacer comprises $SiO_x$, $SiN_x$, or $SiO_xN_y$.

6. A transistor, comprising:
a workpiece;
a gate dielectric disposed over the workpiece;
a gate disposed over the gate dielectric, wherein the gate has a convex upper surface distal the workpiece;
a spacer disposed on sidewalls of the gate and the gate dielectric;
a source/drain region proximate the spacer on a first side of the gate; and
a silicide material disposed over the source/drain region and over the gate, wherein the silicide material disposed over the source/drain region extends beneath the spacer by about 25% or greater than a width of the spacer.

7. The transistor according to claim 6, wherein the silicide material comprises a material selected from the group consisting essentially of Ni, Ti, Co, and a combination thereof.

8. The transistor according to claim 6, wherein the spacer comprises:
a main spacer; and
an offset spacer disposed between the main spacer and the sidewalls of the gate and the gate dielectric, wherein the offset spacer extends at least partially higher than the main spacer.

9. The transistor according to claim 8, wherein an angle between a top surface of the main spacer and a sidewall of the offset spacer is about 90 to 95 degrees measured at a point proximate the sidewall of the offset spacer.

10. The transistor according to claim 6, wherein the silicide material disposed over the source/drain region extends beneath the spacer by about 50% to about 55% of the width of the spacer.

11. The transistor according to claim 6, wherein the spacer has an undercut proximate the workpiece.

12. The transistor according to claim 11, wherein an angle between a top surface of the spacer and a sidewall of the gate is between about 90 degrees and about 95 degrees.

13. A semiconductor device, comprising:
a gate dielectric over a semiconductor workpiece;
a gate disposed over the gate dielectric;
a first spacer disposed on a first sidewall of the gate on a first side of the gate, wherein an angle between a top surface of the first spacer and the first sidewall of the gate is about 90 to 95 degrees, wherein the first spacer has an undercut proximate an upper surface of the semiconductor workpiece;
a first source/drain region proximate the first spacer; and
a first metal-containing layer over the gate, wherein the gate has a curved upper surface contacting the first metal-containing layer, wherein the curved upper surface of the gate extends away from the semiconductor workpiece.

14. The semiconductor device according to claim 13 further comprising a second metal-containing layer disposed on the first source/drain region, wherein the second metal-containing layer extends beneath the first spacer by about 25% or greater than a width of the first spacer.

15. The semiconductor device according to claim 14, further comprising:
another gate dielectric over the semiconductor workpiece;
another gate disposed over the another gate dielectric;
a second spacer disposed on a first sidewall of the another gate on a first side of the another gate, wherein an angle between a top surface of the second spacer and the first sidewall of the another gate is about 90 to 95 degrees; and
a second source/drain region proximate the second spacer, wherein a dielectric layer overlies and contacts the second source/drain region.

16. The semiconductor device according to claim 15, wherein the dielectric layer comprises resist protection oxide (RPO).

17. The semiconductor device according to claim 13, wherein an angle between a sidewall of the first spacer and a top surface of the semiconductor workpiece is less than about 90 degrees.

18. The semiconductor device according to claim 13, wherein the first spacer comprises:
a main spacer, wherein the top surface of the first spacer is a top surface of the main spacer; and
an offset spacer disposed between the main spacer and the first sidewall of the gate and the gate dielectric, wherein the offset spacer extends at least partially higher than the top surface of the main spacer, and wherein the offset spacer and the main spacer comprise different materials.

* * * * *